United States Patent
Sano et al.

(10) Patent No.: US 9,647,027 B2
(45) Date of Patent: May 9, 2017

(54) METHOD FOR MANUFACTURING SEMICONDUCTOR DEVICE

(71) Applicant: CANON KABUSHIKI KAISHA, Tokyo (JP)

(72) Inventors: Hiroaki Sano, Chofu (JP); Yuto Nozaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/046,369

(22) Filed: Feb. 17, 2016

(65) Prior Publication Data

US 2016/0247853 A1 Aug. 25, 2016

(30) Foreign Application Priority Data

Feb. 20, 2015 (JP) ................................. 2015-032001

(51) Int. Cl.
*H01L 21/00* (2006.01)
*H01L 27/146* (2006.01)

(52) U.S. Cl.
CPC .. *H01L 27/14685* (2013.01); *H01L 27/14627* (2013.01); *H01L 27/14687* (2013.01)

(58) Field of Classification Search
CPC .................... H01L 27/14685; H01L 27/14689
See application file for complete search history.

(56) References Cited

U.S. PATENT DOCUMENTS

| | | | | |
|---|---|---|---|---|
| 2004/0112755 | A1* | 6/2004 | Czeczka | H05K 3/424 205/158 |
| 2010/0298605 | A1* | 11/2010 | Hirose | C07C 209/90 564/296 |
| 2013/0335590 | A1* | 12/2013 | Kurihara | H01L 31/02325 348/222.1 |

FOREIGN PATENT DOCUMENTS

JP 2000164836 A 6/2000

* cited by examiner

*Primary Examiner* — Bradley K Smith
(74) *Attorney, Agent, or Firm* — Canon U.S.A. Inc., IP Division

(57) ABSTRACT

An inorganic film is dry-etched using plasma with a photoresist pattern serving as a mask, and an organic film is dry-etched using plasma with the photoresist pattern serving as a mask without exposing a pad electrode. The photoresist pattern is removed using a stripping solution. After the removal of the photoresist pattern using a stripping solution, the organic film is etched to expose the pad electrode with the inorganic film that remains after the dry etching of the inorganic film using plasma serving as a mask.

11 Claims, 6 Drawing Sheets

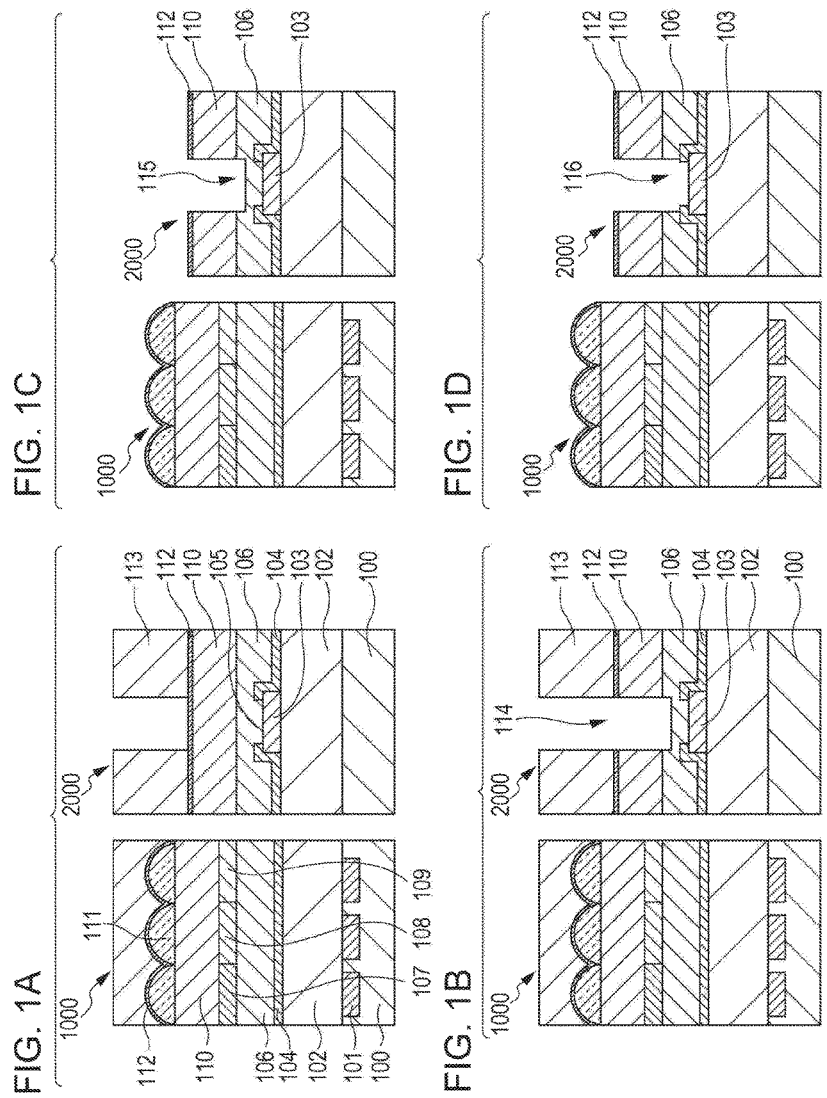

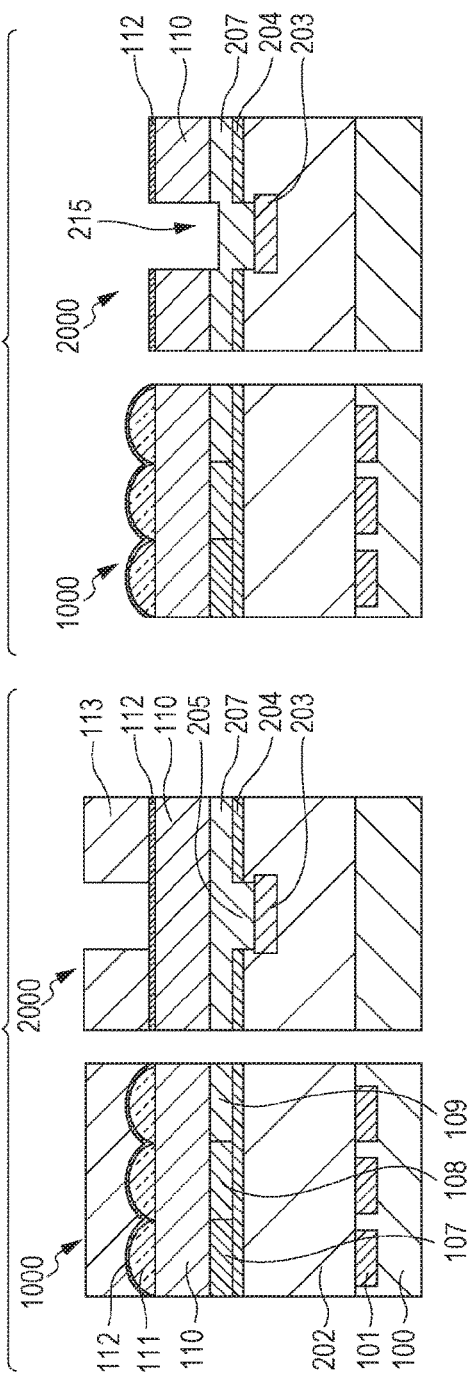
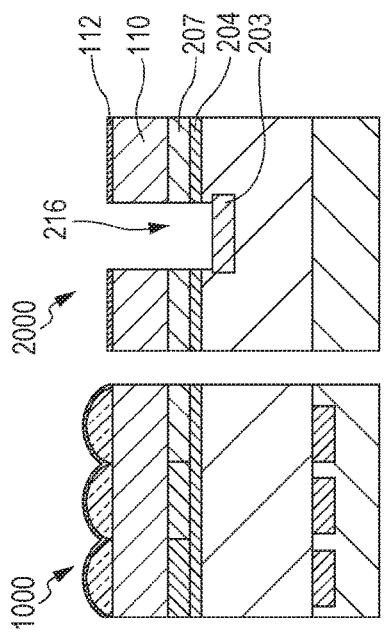
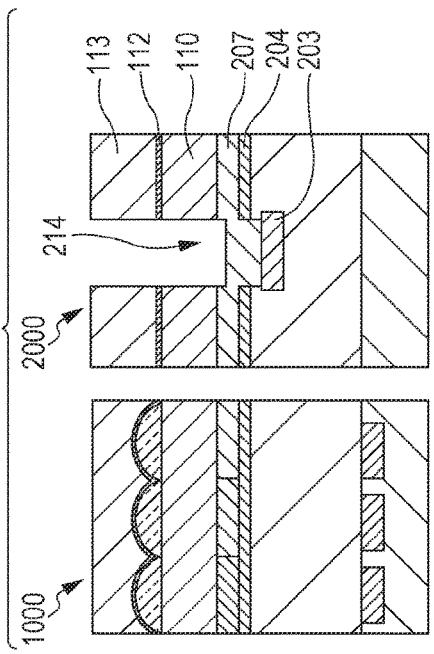

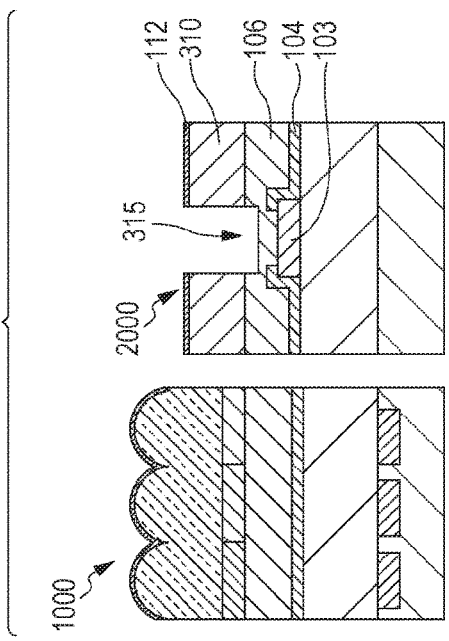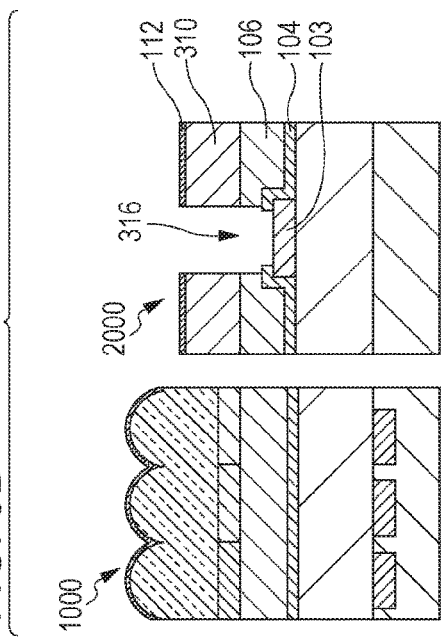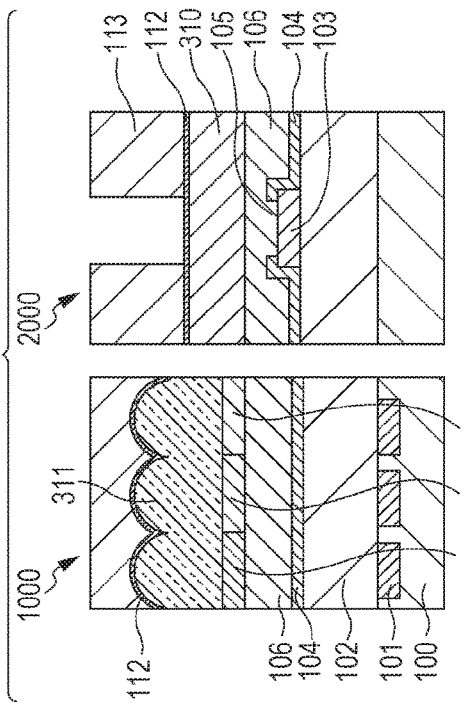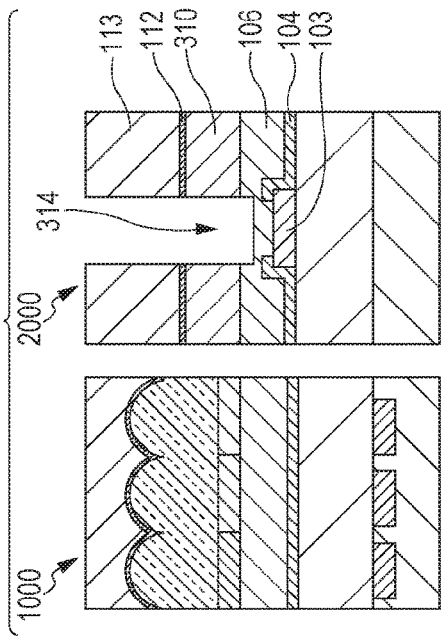

METHOD FOR MANUFACTURING SEMICONDUCTOR DEVICE

BACKGROUND OF THE INVENTION

Field of the Invention

The present invention relates to a method for manufacturing a semiconductor device.

Description of the Related Art

Japanese Patent Laid-Open No. 2000-164836 describes a method for manufacturing a solid-state imaging device, a kind of semiconductor device. The method includes exposing a pad electrode by dry-etching an organic film using plasma with a patterned inorganic film serving as a mask. This process of exposing a pad electrode through plasma dry etching can cause a charge-up and resultant breakdown of the semiconductor device.

SUMMARY OF THE INVENTION

An aspect of the invention provides a method in which a semiconductor device can be manufactured with less risk of charge-up related breakdown of the device despite the use of plasma dry etching in the process of exposing a pad electrode. A method according to an aspect of the invention for manufacturing a semiconductor device includes forming an organic film on a pad electrode, forming an inorganic film on the organic film, forming a photoresist pattern on the organic film for the creation of an opening to the pad electrode of the semiconductor device, dry-etching the inorganic film using plasma with the photoresist pattern serving as a mask, dry-etching the organic film using plasma with the photoresist pattern serving as a mask without exposing the pad electrode, removing the photoresist pattern using a stripping solution, and, after the removing the photoresist pattern using a stripping solution, etching the organic film to expose the pad electrode with the inorganic film that remains after the dry-etching the inorganic film using plasma serving as a mask.

Further features of the present invention will become apparent from the following description of exemplary embodiments with reference to the attached drawings.

BRIEF DESCRIPTION OF THE DRAWINGS

FIGS. 1A to 1D illustratively describe a method according to Embodiment 1 for manufacturing a solid-state imaging device.

FIGS. 3A to 3D illustratively describe a method according to Embodiment 2 for manufacturing a solid-state imaging device.

FIGS. 5A to 5D illustratively describe a method according to Embodiment 3 for manufacturing a solid-state imaging device.

DESCRIPTION OF THE EMBODIMENTS

Figure 2A:
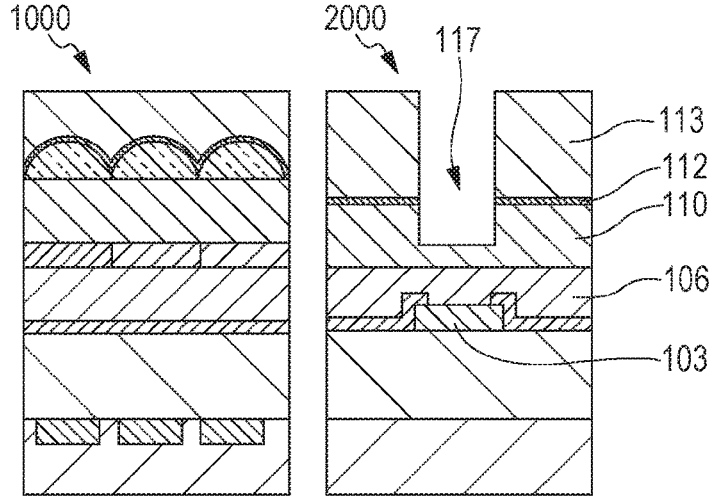
FIGS. 2A and 2B illustratively describe a method according to Embodiment 1 for manufacturing a solid-state imaging device.

The inventors found a problem with the manufacture of a solid-state imaging device: exposing pad electrodes by dry-etching an organic film using plasma can cause dielectric breakdown of some elements in the semiconductor device. Dielectric breakdown can occur anywhere in the semiconductor device, but often at, for example, the gate insulating film section of an insulated-gate field-effect transistor. This problem has been becoming more significant as semiconductor devices have been getting smaller and gate insulating films have been getting thinner.

After some investigations into the breakdown of a gate insulating film that can be caused by plasma dry etching, speculation arose that the following mechanism lies. That is, during the process of plasma dry etching, the plasma is nonuniform in the chamber. The amount of charge that accumulates in regions such as the side walls of the opening to a pad electrode and the photoresist pattern should therefore vary from pad electrode to pad electrode. This means that if pad electrodes are exposed through etching with the photoresist pattern remaining charged, electric current flows from pad electrodes to others because of the difference in potential between the pad electrodes. This flow of current breaks down the gate insulating film of transistors.

The inventors conceived that removing the charge before exposing the pad electrodes would reduce the risk of the breakdown of gate insulating films and arrived at the present invention. The following describes a solid-state imaging device as an example of a semiconductor device. Note that the present invention can be applied to any other semiconductor device that can be manufactured through a process in which an organic film is formed on or above a pad electrode and plasma dry etching is used to expose the pad electrode.

Embodiment 1

The following describes a method according to an aspect of the invention for manufacturing a solid-state imaging device with reference to FIGS. 1A to 1D and 2A and 2B.

FIG. 1A illustrates an in-process solid-state imaging device. The solid-state imaging device has an image pick-up area 1000 and a pad area 2000. The image pick-up area 1000 and the pad area 2000 in FIG. 1A are depicted as separate areas but this is for the sake of simplicity. In fact the image pick-up area 1000 and the pad area 2000 share many components such as a substrate 100.

The image pick-up area 1000 has photoelectric conversion sections 101 and a wiring structure 102 on the substrate 100. The wiring structure 102 includes multiple wiring layers, transistors, and interlayer insulating films (not illustrated). Charge that accumulates in the photoelectric conversion sections 101 is transferred by a MOS transistor and used to form an image.

In the pad area 2000, there is a pad electrode 103 on the wiring structure 102. There may be an interlayer insulating film shared by the image pick-up area 1000 and the pad area 2000 in the wiring structure 102.

A passivation coating 104 is then placed on the wiring structure 102 and the pad electrode 103, and this passivation coating 104 is selectively etched in a region above the pad electrode 103. This creates a pad opening 105 through which the top of the pad electrode 103 is exposed. The passivation coating 104 is a film of silicon nitride, a film of silicon oxide nitride, a stack of these films, or similar.

An planarizing coating 106, an organic film, is then formed on the wiring structure 102 across the image pick-up area 1000 and the pad area 2000. In the pad area 2000, the passivation coating 104 and the opening 105 are covered with this planarizing coating 106. The planarizing coating 106 is made of acrylic resin (e.g., JSR Corporation AH859-R19) or similar.

Then in the image pick-up area 1000 a first color filter 107, a second color filter 108, and a third color filter 109 are placed corresponding to the photoelectric conversion sections 101. The patterns of these color filters are formed through the application, exposure, and development of materials for the color filters. The colors of the first color filter 107, the second color filter 108, and the third color filter 109 are, for example, green, blue, and red, respectively.

A planarizing coating 110, an organic film, is then placed across the image pick-up area 1000 and the pad area 2000. On this planarizing coating 110, microlenses 111 are formed corresponding to the photoelectric conversion sections 101. The planarizing coating 110 is made of acrylic resin (e.g., JSR Corporation AH859-R19) or similar. The planarizing coatings 110 and 106 can be made of the same material or different materials.

The microlenses 111 can be produced through exposure using grayscale mask and etch back or the reflow technique. In the pad area 2000, it is not essential that there be on the planarizing coating 110 a layer of the material of which the microlenses 111 are made. FIGS. 1A to 1D illustrate an embodiment in which on the planarizing coating 110 in the pad area 2000 there is no such layer of the material of which the microlenses 111 are made.

An antireflection coating 112, an inorganic film, is then formed on the microlenses 111 in the image pick-up area 1000. The antireflection coating can be, for example, a film of silicon oxide (SiO), a film of silicon nitride (SiN), or a stack of films made of these materials.

A photoresist pattern 113 is then formed in the pad area 2000 through a photolithographic process, including the application, exposure, and development of photoresist. The photoresist pattern 113 is used to create an opening to the pad electrode 103.

Then as illustrated in FIG. 1B, the antireflection coating 112 is etched with the photoresist pattern 113 serving as a mask. The planarizing coating 110 and part of the planarizing coating 106 are also etched using the photoresist pattern 113 as a mask. This creates an opening 114. In this process of etching, the planarizing coating 106 is removed only halfway through its thickness so that the pad electrode 103 remains covered. If there is in the pad area 2000 a layer of the material of which the microlenses 111 are made, this process of etching also creates an opening in this layer of the material for the microlenses 111.

This process of etching includes two operations: dry-etching the antireflection coating 112 with plasma, and dry-etching other components such as the planarizing coating 110 with plasma.

The antireflection coating 112 is an inorganic film and the conditions under which this coating is dry-etched with plasma include, for example, an atmosphere containing a CF-based gas. An example set of conditions is given below.
Conditions 1
 Etching gas: $CF_4$
 Power: 100 to 1500 (W)
 Pressure: 30 to 750 (mTorr)

The CF-based gas refers to a gas that contains C and F. Examples other than $CF_4$ include, but are not limited to, compounds such as $C_4F_8$, $C_5F_8$, and $C_4F_6$ and combinations of these. An Ar gas and/or an $O_2$ gas may be added.

The planarizing coatings 110 and 106 are organic films and the conditions under which these coatings are dry-etched with plasma include, for example, an atmosphere containing $O_2$ and $N_2$ gases. An example set of conditions is given below. Either an $O_2$ or $N_2$ gas alone can also be used. A CF-based gas and/or an Ar gas may be added.

Conditions 2
 Etching gas: $O_2/N_2$
 Power: 100 to 1500 (W)
 Pressure: 30 to 750 (mTorr)

Then as illustrated in FIG. 1C, the photoresist pattern 113 is removed using an organic stripping solution, creating an opening 115. The organic stripping solution can be of any kind that removes the photoresist pattern 113. An example is Kanto Chemical SWPR-207.

The organic stripping solution is used mainly to remove the photoresist pattern 113, but this also results in the removal of the charge that has accumulated in regions such as the photoresist pattern 113 and the side walls of the opening 114 in the planarizing coating 110.

At this point, part of the planarizing coating 106 remains on the top of the pad electrode 103 and the pad electrode 103 is still covered. The charging damage therefore does not affect gate insulating films. The organic stripping solution also removes the charge that has accumulated in regions such as the side walls of the opening 114.

The photoresist pattern 113 used as a mask is removed by the organic stripping solution. The subsequent process of etching to expose the pad electrode therefore uses the patterned antireflection coating 112 as a mask.

Then as illustrated in FIG. 1D, the residual planarizing coating 106 is etched with the antireflection coating 112 serving as a mask, creating a pad opening 116 and exposing the pad electrode 103. No electric current flows from pad electrodes to others because accumulated charge has already been removed by the organic stripping solution. As a result, the risk of charge-up related breakdown of gate insulating films is reduced. The manufacturing method described in this embodiment is suitable particularly for devices such as MOS transistors having a thin gate insulating film having a thickness of 4.5 nm or less.

The planarizing coating 106 left on the pad electrode 103 needs to be thick enough that the pad electrode is not exposed. Given the variations in thickness and etching rate that occur in forming the planarizing coating 106, the thickness of the planarizing coating 106 left on the pad electrode 103 can be 200 nm or more.

For the risk of the breakdown of gate insulating films to be effectively reduced, it is important to remove as much charge as possible from the regions storing charge, such as the photoresist pattern 113 and the side walls of the opening in the planarizing coating 110. If plasma dry etching is used to expose the pad electrode 103, however, charge accumulates again in the side walls of the opening and other regions. In such a case, the thickness of the planarizing coating 106 left on the pad electrode 103 can be 500 nm or less. The thickness of the planarizing coating 106 left on the pad electrode 103 can therefore be 200 nm or more and 500 nm or less.

The process of etching to expose the pad electrode 103 can be through plasma dry etching or wet etching. Plasma dry etching allows for dimensional control through anisotropic etching, whereas wet etching is plasma-free and therefore less damaging.

In a possible variation, the process of etching in which the photoresist pattern 113 serves as a mask may be as in FIG. 2A. That is, part of the planarizing coating 110 may be etched as well as the antireflection coating 112, creating an opening 117.

Figure 2B:
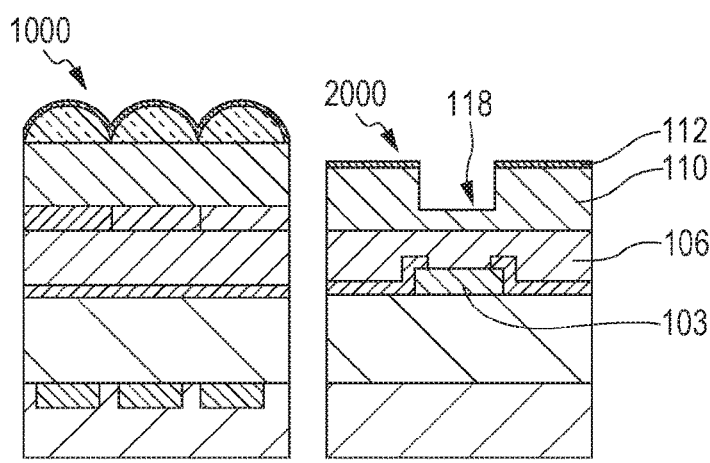

Then as illustrated in FIG. 2B, the photoresist pattern 113 is removed using an organic stripping solution, creating an opening 118. The organic stripping solution also serves to remove the charge that has accumulated in regions such as the photoresist pattern 113 and the side walls of the opening 117 in the planarizing coating 110.

Then as illustrated in FIG. 1D, the residual planarizing coating 110 and the planarizing coating 106 are etched with the antireflection coating 112 serving as a mask, exposing the pad electrode 103 and creating a pad opening 116.

Embodiment 2

FIGS. 3A to 3D and 4A and 4B illustrate a method according to this embodiment for manufacturing a solid-state imaging device. The reference numerals used in describing Embodiment 1 represent the same components as in Embodiment 1.

In this embodiment, unlike Embodiment 1, there is in the pad area 2000 a film 207 made of the same material as a color filter.

In FIG. 3A, a wiring structure 202 is formed in the image pick-up area 1000 and the pad area 2000. The wiring structure 202 includes multiple wiring layers, transistors, and interlayer insulating films (not illustrated). In this embodiment, the wiring structure 202 encloses a pad electrode 203. There may be an interlayer insulating film shared by the image pick-up area 1000 and the pad area 2000 in the wiring structure 202.

A passivation coating 204 is placed on the wiring structure 202 across the image pick-up area 1000 and the pad area 2000. The passivation coating 204 is a film of silicon nitride, a film of silicon oxide nitride, a stack of these films, or similar.

Then in the pad area 2000, the wiring structure 202 and the passivation coating 204 are selectively etched in a region above the pad electrode 203, exposing the top of the pad electrode 203 and creating a pad opening 205.

Then in the image pick-up area 1000, a first color filter 107, a second color filter 108, and a third color filter 109 corresponding to the photoelectric conversion sections 101 are formed through an exposure process. In this embodiment, a color filter material film 207 is patterned in such a manner that the color filter material film 207 fills the pad opening 205. For example, the color filter material film 207 is made of the same material as the third color filter 109.

Then a planarizing coating 110, which is an organic film, microlenses 111, and an antireflection coating 112, which is an inorganic film, are formed in the image pick-up area 1000 and the pad area 2000. A photoresist pattern 113 is then formed across the image pick-up area 1000 and the pad area 2000.

Then as illustrated in FIG. 3B, the antireflection coating 112 is etched with the photoresist pattern 113 serving as a mask. The planarizing coating 110 and the first color filter material film 207 are also etched using the photoresist pattern 113 as a mask. This creates an opening 214. This process of etching is therefore performed in such a manner that the pad electrode 203 remains covered and part of the first color filter material film 207 is left.

The process of plasma dry etching for the antireflection coating 112 uses, for example, a CF-based gas. The process of plasma dry etching for the planarizing coating 110 and the first color filter material film 207 uses, for example, an $O_2$ gas.

Then as illustrated in FIG. 3C, the photoresist pattern 113 is removed using an organic stripping solution, creating an opening 215 in the planarizing coating 110 and the first color filter material film 207. The organic stripping solution serves to remove the charge that has accumulated in regions such as the photoresist pattern 113 and the side walls of the opening 214 in the planarizing coating 110, reducing the risk of charge-up related breakdown of gate insulating films.

The first color filter material film 207 left on the pad electrode 203 needs to be thick enough that the pad electrode is not exposed. Given the variations in thickness and etching rate that occur in forming the first color filter material film 207, the thickness of the first color filter material film 207 left on the pad electrode 203 can be 200 nm or more. If plasma dry etching is used to expose the pad electrode 203, the thickness of the first color filter material film 207 left on the pad electrode 203 can be 500 nm or less so that the accumulation of charge is limited.

Then as illustrated in FIG. 3D, the residual first color filter material film 207 is etched to expose the pad electrode 203 with the antireflection coating 112 serving as a mask. This creates a pad opening 216.

Figure 4A:
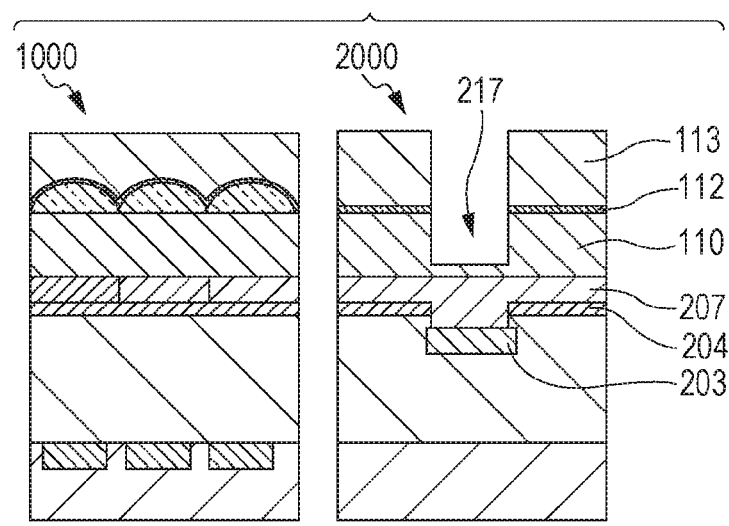
FIGS. 4A and 4B illustratively describe a method according to Embodiment 2 for manufacturing a solid-state imaging device.
Figure 4B:
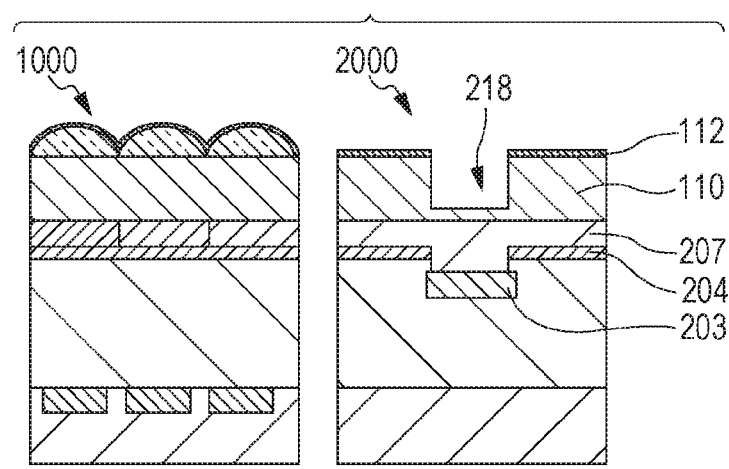

In a possible variation, the process of etching in which the photoresist pattern 113 serves as a mask may be as in FIG. 4A. That is, this process of etching may be terminated in the planarizing coating 110 before reaching the first color filter material film 207. Then as illustrated in FIG. 4B, the photoresist pattern 113 is removed using an organic stripping solution, creating an opening 218. The organic stripping solution serves to remove the charge that has accumulated in regions such as the photoresist pattern 113 and the side walls of the opening in the planarizing coating 110, reducing the risk of charge-up related breakdown of gate insulating films.

The planarizing coating 110 and the first color filter material film 207 left under the opening 218 are then etched with the antireflection coating 112 serving as a mask, exposing the pad electrode 203 as illustrated in FIG. 3D. This creates a pad opening 216.

The arrangement used in this embodiment, i.e., filling the opening to the pad electrode 203 with a material for a color filter, can also be used in Embodiment 1.

Embodiment 3

FIGS. 5A to 5D and 6A and 6B illustrate a method according to this embodiment for manufacturing a solid-state imaging device. The reference numerals used in describing the preceding embodiments represent the same components as in those embodiments.

In this embodiment, unlike Embodiments 1 and 2, there is a microlens material film 310 (a film made of the same material as the microlenses) in the pad area 2000, and the planarizing coating 110 is absent in the image pick-up area 1000 and the pad area 2000.

The method according to this embodiment is the same as in Embodiment 1 up until the formation of the first color filter 107, the second color filter 108, and the third color filter 109.

Then a microlens material film 310 is formed across the image pick-up area 1000 and the pad area 2000. In the image pick-up area 1000, exposure using grayscale mask and etch back are performed to form microlenses 311. In this embodiment, this process of exposure and etching is such that the microlens material film 310, an organic film, is left in the pad area 2000. The microlenses 311 are covered with an antireflection coating 112.

Then as illustrated in FIG. 5B the antireflection coating 112, the microlens material film 310, and part of the planarizing coating 106 are etched with the photoresist pattern 113 serving as a mask, creating an opening 314. The planarizing coating 106 is etched only halfway through its thickness so that the pad electrode 103 remains covered. The process of plasma dry etching for the antireflection coating 112 uses, for example, a CF-based gas. The process of plasma dry etching for the microlens material film 310 and the planarizing coating 106 uses, for example, an $O_2$ gas.

Then as illustrated in FIG. 5C, the photoresist pattern 113 is removed using an organic stripping solution, creating an opening 315. The organic stripping solution serves to remove the charge that has accumulated in regions such as the photoresist pattern 113 and the side walls of the opening in the microlens material film 310, reducing the risk of charge-up related breakdown of gate insulating films. The planarizing coating 106 left on the pad electrode 103 needs to be thick enough that the pad electrode 103 is not exposed. Given the variations in thickness and etching rate that occur in forming the planarizing coating 106, the thickness of the planarizing coating 106 left on the pad electrode 103 can be 200 nm or more. If plasma dry etching is used to expose the pad electrode 103, the thickness of the planarizing coating 106 left on the pad electrode 103 can be 500 nm or less so that the accumulation of charge is limited.

Then with the antireflection coating 112 serving as a mask, the residual planarizing coating 106 is etched to expose the pad electrode 103, creating a pad opening 316 as illustrated in FIG. 5D.

Figure 6A:
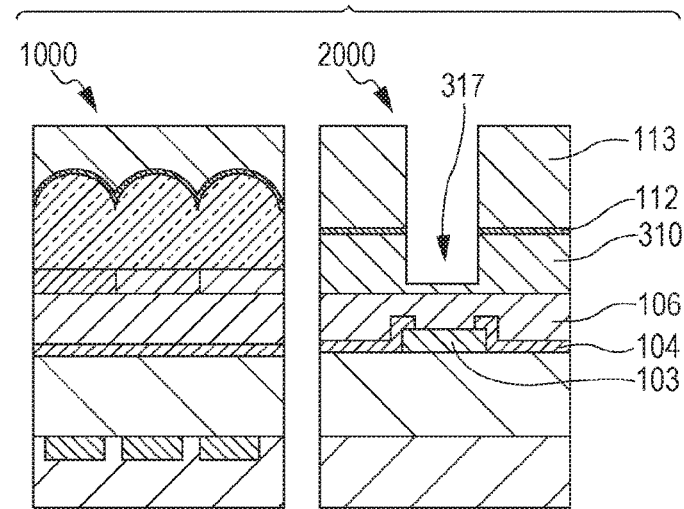
FIGS. 6A and 6B illustratively describe a method according to Embodiment 3 for manufacturing a solid-state imaging device.

In a possible variation, the process of etching in which the photoresist pattern 113 serves as a mask may be as in FIG. 6A. That is, part of the microlens material film 310 may be etched as well as the antireflection coating 112, creating an opening 317.

Figure 6B:
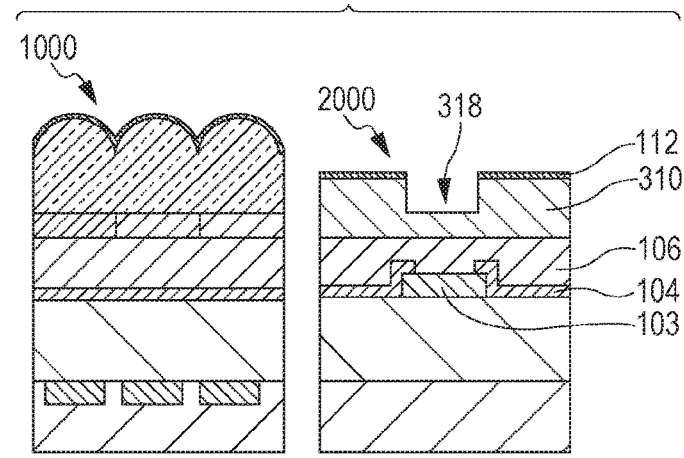

Then as illustrated in FIG. 6B, the photoresist pattern 113 is removed using an organic stripping solution, creating an opening 318. The organic stripping solution serves to remove the charge that has accumulated in regions such as the photoresist pattern 113 and the side walls of the opening in the microlens material film 310, reducing the risk of charge-up related breakdown of gate insulating films.

Then as illustrated in FIG. 5D, the planarizing coating 106 is etched with the antireflection coating 112 serving as a mask, exposing the pad electrode 103 and creating a pad opening 316.

The foregoing describes Embodiments 1 to 3 of an aspect of the invention. Any elements of these embodiments can be optionally combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-032001 filed Feb. 20, 2015, which is hereby incorporated by reference herein in its entirety.

What is claimed is:

1. A method for manufacturing a semiconductor device, the method comprising:
   forming an organic film on a pad electrode;
   forming an inorganic film on the organic film;
   forming a photoresist pattern on the inorganic film for creation of an opening to the pad electrode of the semiconductor device;
   dry-etching the inorganic film using plasma with the photoresist pattern serving as a mask;
   dry-etching the organic film using plasma with the photoresist pattern serving as a mask without exposing the pad electrode;
   removing the photoresist pattern using a stripping solution, and;
   after the removing the photoresist pattern using a stripping solution, etching the organic film to expose the pad electrode with the inorganic film that remains after the dry-etching the inorganic film using plasma,
   wherein the inorganic film that remains after the dry-etching serves as a mask in the etching the organic film to expose the pad electrode.

2. he method according to claim 1 for manufacturing a semiconductor device, wherein the dry-etching the inorganic film using plasma with the photoresist pattern serving as the mask is carried out in an atmosphere containing a CF-based gas.

3. The method according to claim 1 for manufacturing a semiconductor device, wherein the dry-etching the organic film using plasma without exposing the pad electrode is carried out in an atmosphere containing an $O_2$ or $N_2$ gas.

4. The method according to claim 1 for manufacturing a semiconductor device, wherein the etching the organic film to expose the pad electrode includes plasma dry etching or wet etching.

5. The method according to claim 1 for manufacturing a semiconductor device, wherein the organic film that remains after the dry-etching part of the organic film using plasma without exposing the pad electrode has a thickness of 200 nm or more and 500 nm or less.

6. The method according to claim 1 for manufacturing a semiconductor device, wherein the organic film includes a planarizing coating on the pad electrode.

7. The method according to claim 1 for manufacturing a semiconductor device, wherein:
   the semiconductor device is an imaging device;
   the imaging device has a color filter; and
   the organic film includes a planarizing coating on the color filter.

8. The method according to claim 7 for manufacturing a semiconductor device, wherein the organic film includes a film made of a same material as the color filter.

9. The method according to claim 7 for manufacturing a semiconductor device, wherein:
   the imaging device has a microlens on the color filter; and
   the organic film includes a film made of a same material as the microlens.

10. The method according to claim 7 for manufacturing a semiconductor device, wherein:
    the imaging device has a microlens on the color filter; and
    the inorganic film is an antireflection coating on the microlens.

11. The method according to claim 1, wherein, in the step of removing the photoresist pattern using the stripping solution, charge accumulated in the step of dry-etching the organic film using plasma, is removed.

* * * * *